(12) United States Patent
Bahramzadeh

(10) Patent No.: US 6,194,945 B1
(45) Date of Patent: Feb. 27, 2001

(54) DUAL THRESHOLD DIGITAL RECEIVER WITH LARGE NOISE MARGIN

(75) Inventor: Hamid Bahramzadeh, Eagan, MN (US)

(73) Assignee: Unisys Corporation, Blue Bell, PA (US)

( * ) Notice: Subject to any disclaimer, the term of this patent is extended or adjusted under 35 U.S.C. 154(b) by 1113 days.

(21) Appl. No.: 08/551,981

(22) Filed: Nov. 2, 1995

Related U.S. Application Data

(63) Continuation of application No. 08/275,555, filed on Jul. 15, 1994, now abandoned.

(51) Int. Cl.[7] ................................................... H03K 19/20
(52) U.S. Cl. .......................... 327/333; 327/437; 327/108; 327/537; 326/38; 326/62; 326/68
(58) Field of Search .............................. 326/80, 81, 83, 326/68, 62, 59, 60; 327/379, 383, 387, 389, 108, 543, 537, 437

(56) References Cited

U.S. PATENT DOCUMENTS

| | | | |
|---|---|---|---|
| 4,533,841 | * 8/1985 | Konishi | 326/62 |
| 5,019,725 | * 5/1991 | Yoshino | 326/68 |
| 5,216,299 | * 6/1993 | Wanlass | 327/210 |

* cited by examiner

Primary Examiner—Dinh T. Le
(74) Attorney, Agent, or Firm—Charles J. Fassbender; Mark T. Starr; Rocco L. Adornato

(57) ABSTRACT

A receiver circuit has a high threshold of 3.3÷2 volts and maximum noise margin. This is achieved by making two transistors in the receiver have channel resistances, under the condition whereas input line carries 3.3÷2 volts and a control line carries 0 volts, that generate an output signal as a first resistance ratio which when multiplied by a supply voltage equals 3.3÷2 volts. Further, the receiver also has a low threshold of 2.5÷2 volts and maximum noise margin. This is achieved by making the above two transistors, plus two other transistors in the receiver, have respective channel resistances under the condition where the input line carries 2.5÷2 volts and the control signal line carries 3.3 volts, that generate the output signal as a second resistance ratio which when multiplied by the supply voltage again equals 3.3÷2 volts.

7 Claims, 5 Drawing Sheets

|    | C1 | C2 | C3 | C4 | C5 |
|----|----|----|----|----|----|
| T3 | $\frac{55}{0.7}$ | $\frac{65}{0.7}$ | $\frac{45}{0.7}$ | $\frac{55}{0.8}$ | $\frac{75}{0.7}$ |
| T4 | $\frac{55}{0.7}$ | $\frac{40}{0.7}$ | $\frac{85}{0.7}$ | $\frac{75}{0.7}$ | $\frac{55}{0.8}$ |

FIG. 7

DUAL THRESHOLD DIGITAL RECEIVER WITH LARGE NOISE MARGIN

This is a of application Ser. No. 08/275, 555 filed on Jul. 15, 1994 now abandoned.

BACKGROUND OF THE INVENTION:

This invention relates to digital receiver circuits; and more particularly, it relates to a novel circuit structure which enables the receiver to selectively have a high threshold voltage with a large noise margin or a low threshold voltage with a large noise margin.

Conventionally, digital receiver circuits are used in various types of data processing systems where a plurality of digital logic chips are interconnected to each other. There, the receiver circuit acts as a buffer between the input terminals of a chip and the chip's internal operating circuitry. For example, one chip may be a microprocessor, and another chip may be a memory which supplies data to the microprocessor. In that case, the data is sent from the memory to the microprocessor as several bits in parallel; and each of those bits is passed through a respective receiver circuit in the microprocessor chip before being otherwise acted upon.

Each bit of data which is sent to its respective receiver circuit has a "0" voltage level and a "1" voltage level; and ideally, the receiver circuit should have a threshold voltage which is midway between the "0" and "14" voltage levels. By definition, the threshold voltage of the receiver is the input voltage which causes the receiver output to be at half of the "1" voltage level. When the receiver circuit has such a threshold voltage, the difference between a "0" input voltage and the threshold voltage equals the difference between a "1" input voltage and the threshold voltage; and thus the noise margins on the input signal are as large as possible.

However, in the integrated circuit industry, new chips are continually being developed; and from time to time, a new chip is developed with a reduced "1" voltage level in comparison to the pre-existing chips. Recently, the standard "1" voltage level was reduced from 5 volts to 3.3 volts. In three to five years, it is likely that new chips will become available which have a further reduced "1" voltage level of only 2.5 volts. After that, new chips are expected to have an even further reduced "1" voltage level of only about 1.7 volts.

By reducing the "1" voltage level, the circuitry which is on an integrated circuit chip can be reduced in size; and thus, a single chip can contain more circuits per unit area. For example, a memory chip which has a "1" voltage level of 2.5 volts can contain more memory cells than a memory chip of the same size which has a "1" voltage level of 3.3 volts. However, reducing the "1" voltage level of just one particular chip presents a system problem of how to incorporate that chip into a previously designed system which has other chips that operate at a higher "1" voltage level.

Suppose, for example, that a new high density memory chip becomes available which has a reduced "1" voltage level of 2.5 volts, but no new microprocessor chip is available with the same reduced "1" voltage level. From a systems viewpoint it would be desirable to use the new memory chip in order to take advantage of its higher memory density. But if the new memory chip is used with a pre-existing microprocessor chip which has a "1" voltage level of 3.3 volts, then the receiver circuits in the microprocessor chip will operate with a reduced noise margin. Thus, the resulting system will be susceptible to errors which are caused by noise on the "1" or "0" voltage levels.

Accordingly, a primary object of the invention is to overcome the above problem by providing a novel structure for a receiver circuit which selectively has both a high threshold voltage with maximum noise margin and a low threshold voltage with maximum noise margin.

BRIEF SUMMARY OF THE INVENTION

In accordance with the present invention, a dual threshold digital receiver circuit is comprised of four transistors. The first transistor and the second are interconnected in series from a voltage supply bus to a ground bus; whereas the third transistor and the fourth transistor are interconnected in series from the connection between the first and second transistors to the ground bus. An input line is connected to respective gates on the first, second, and third transistors; a control line is connected to a gate on the fourth transistor; and an output line is connected to the series connection between the first and second transistors.

In one embodiment, the receiver circuit has a high threshold of 3.3÷2 volts and maximum noise margin. This is achieved by making the first and second transistors have channel resistances, under the condition where the input line carries 3.3÷2 volts and the control line carries 0 volts, that generate an output signal as a first resistance ratio which when multiplied by the supply voltage equals 3.3÷2 volts. Further, the receiver also has a low threshold of 2.5÷2 volts and maximum noise margin. This is achieved by making all four of the transistors have respective channel resistances, under the condition where the input line carries 2.5÷2 volts and the control signal line carries 3.3 volts, that generate the output signal as a second resistance ratio which when multiplied by the supply voltage again equals 3.3÷2 volts.

BRIEF DESCRIPTION OF THE DRAWINGS

FIG. 7 is a table which illustrates several channel width-channel length ratios which are suitable for two of the transistors in the FIG. 4 receiver circuit.

DETAILED DESCRIPTION

Figure 1:
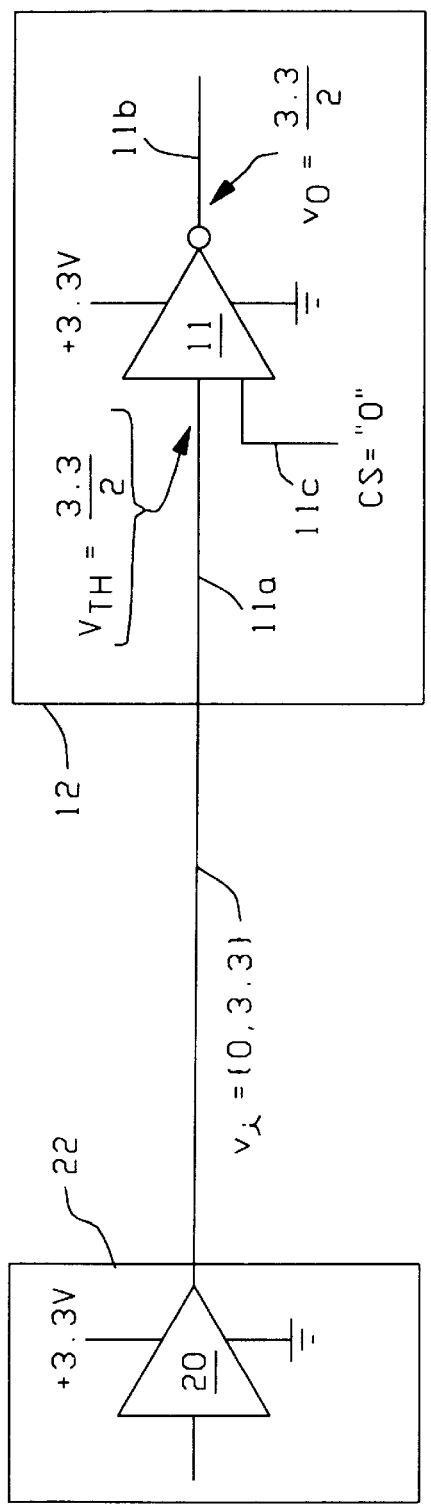
FIG. 1 shows a dual threshold digital receiver circuit which in accordance with the present invention is operating with a high threshold voltage in response to a control signal CS="0".
Figure 2:
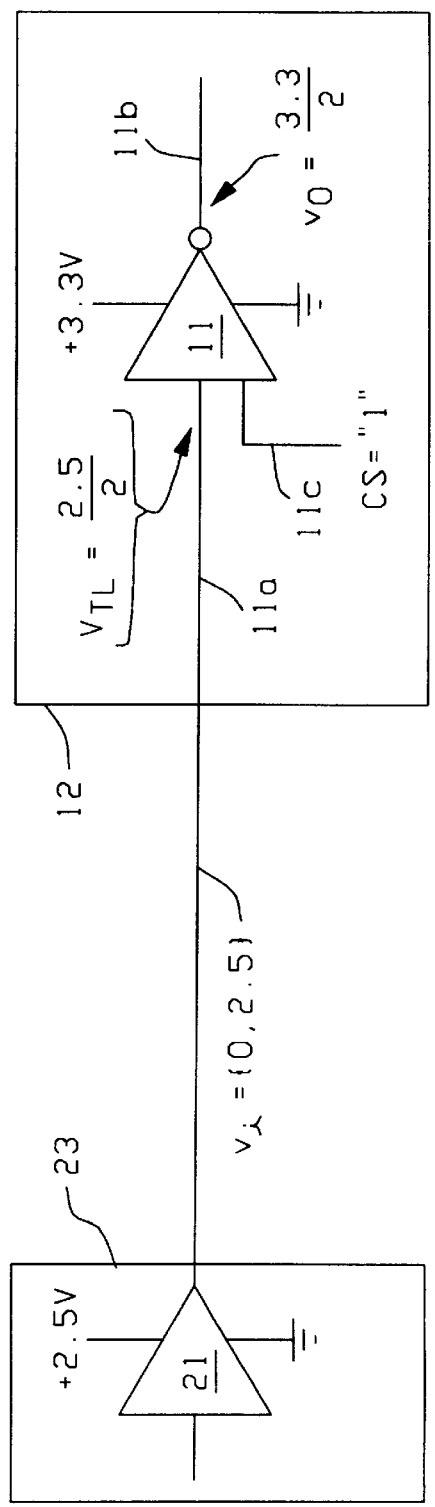
FIG. 2 shows the dual threshold digital receiver circuit of FIG. 1 which in accordance with the present invention is operating with a low threshold voltage in response to a control signal CS="1".
Figure 3:
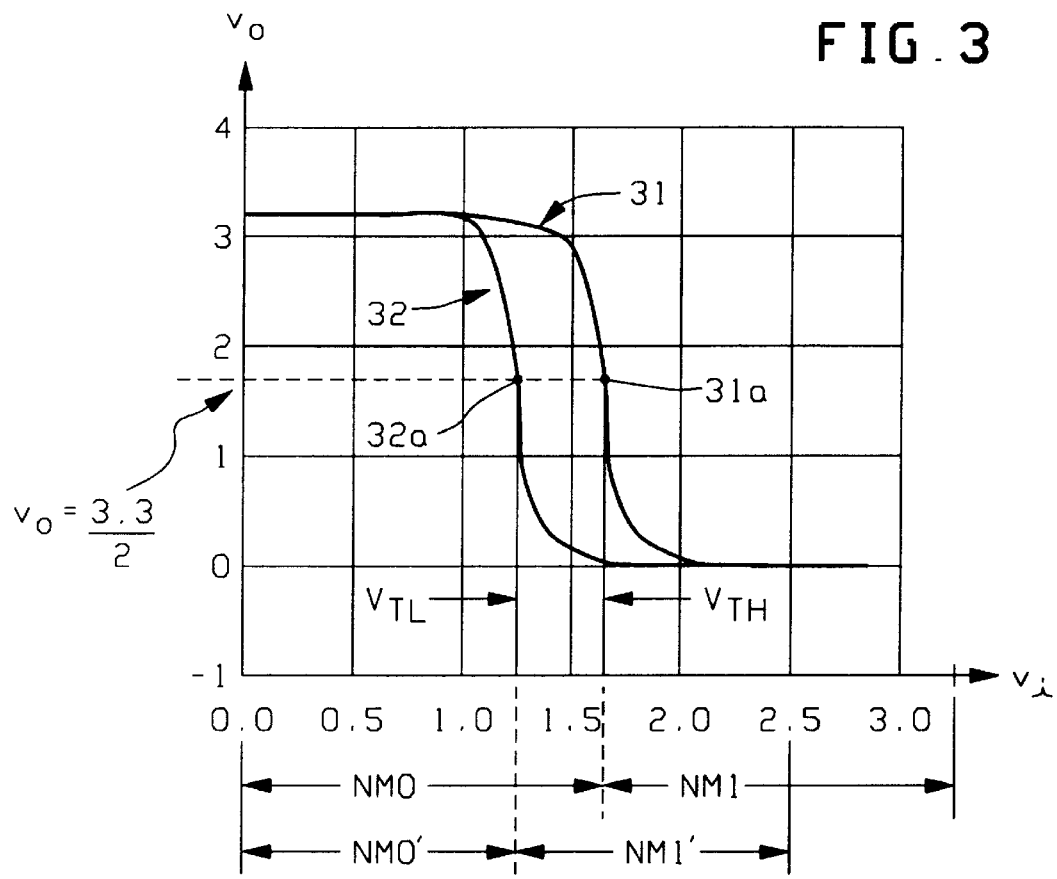
FIG. 3 is a graph which shows how the noise margins in the receiver circuit of FIGS. 1 and 2 are maximized while selecting either the high threshold voltage or the low threshold voltage.

Referring now to FIGS. 1–3, the operation of the present invention from a high level systems viewpoint will be described. In FIGS. 1 and 2, a dual threshold digital receiver circuit 11 is shown which constitutes one preferred embodiment of the invention; and this receiver circuit 11 is contained within an integrated circuit chip 12. Also in both FIGS. 1 and 2, an input line to the receiver circuit is indicated by reference numeral 11a; an output line from the receiver is indicated by reference numeral 11b; and a control line to the receiver is indicated by reference numeral 11c.

When the control line 11c carries a control signal CS which is at a logical "0" voltage level, the receiver circuit 11 operates with a high threshold voltage $V_{TH}$ which equals 3.3 volts divided by 2. This mode of operation is illustrated in FIG. 1. By comparison, when the control signal CS on the control line 11c is at a logical "1" voltage level, the receiver circuit 11 operates with a low threshold voltage $V_{TL}$ which equals 2.5 volts divided by 2; and this mode of operation is illustrated in FIG. 2.

By having the high threshold voltage $V_{TH}$, the receiver circuit 11 is able to receive a digital input signal $v_i$, which has "0" and "1" voltage levels of 0 and 3.3 volts, with the largest noise margin that is possible. This is illustrated in FIG. 1 wherein the 0 and 3.3 volt digital input signal is generated on the input line 11a by a transmitter 20.

Likewise, by having the low threshold $V_{TL}$, the digital circuit 11 is able to receive a digital input signal which has "0" and "1" voltage levels of 0 and 2.5 volts with the largest noise margin that is possible. This is illustrated in FIG. 2 wherein the 0 and 2.5 volt digital input signal is generated by a transmitter 21.

Each of the above noise margins are further illustrated in FIG. 3. There, a graph is provided wherein the input voltage $v_i$ to the receiver circuit 11 is plotted on a horizontal axis; and the output voltage $v_o$ from the receiver circuit 11 is plotted on a vertical axis. In that graph, a curve 31 shows how the output voltage $v_o$ varies as a function of the input voltage $v_i$ when the control signal CS is a "0"; and another curve 32 shows how the output voltage varies as a function of the input voltage when the control signal CS is a "1".

Inspection of curve 31 shows that on it, the high threshold voltage $V_{TH}$ of the receiver occurs at a point 31a. By definition, the threshold voltage of the receiver is the input voltage which causes the receiver output to be at its "1" output voltage divided by two.

At point 31a, the receiver input voltage is 3.3 volts divided by 2; and that is midway between the two input signal levels of 0 and 3.3 volts. Consequently, the noise margin NM0 between 0 volts and the high threshold voltage, as well as the noise margin NM1 between 3.3 volts and the high threshold voltage, are as large as possible.

Likewise, inspection curve 32 shows that the low threshold voltage $V_{TL}$ occurs at a point 32a. Here again, this threshold voltage is the input voltage which causes the receiver output to be at its "1" output voltage level divided by two. At point 32a, the receivers input voltage is 2.5 volts divided by 2. Consequently, the noise margin NN0' between 0 volts and the low threshold voltage, as well as the noise margin NM1' between 2.5 volts and the low threshold voltage, are as large as possible.

From a systems viewpoint, the above feature of being able to shift the threshold voltage of the receiver 11 is very important because it enables the chip 12 to be part of the data processing system which is easily upgraded. For example, suppose -a) that the chip 12 is a microprocessor chip on which the 3.3 volt receiver 11 is replicated multiple times and receives all of the signals for the microprocessor, and, that the 3.3 volt transmitter is likewise replicated multiple times on a memory chip 22 which supplies data through the replicated transmitters to the microprocessor.

While a system with the above chips 12 and 22 is being marketed, another memory chip 23 could become available which has more memory cells than the memory chip 22 but which transmits its output signals with the 2.5 volt transmitters 21. In that case, an upgraded system can be provided in which the memory chip 23 replaces the chip 22; and no loss in noise margin will occur simply by switching the control signal CS from a "0" to a "1". This is a major advantage since a new microprocessor chip which operates completely at 2.5 volts could take years to develop.

Figure 4:
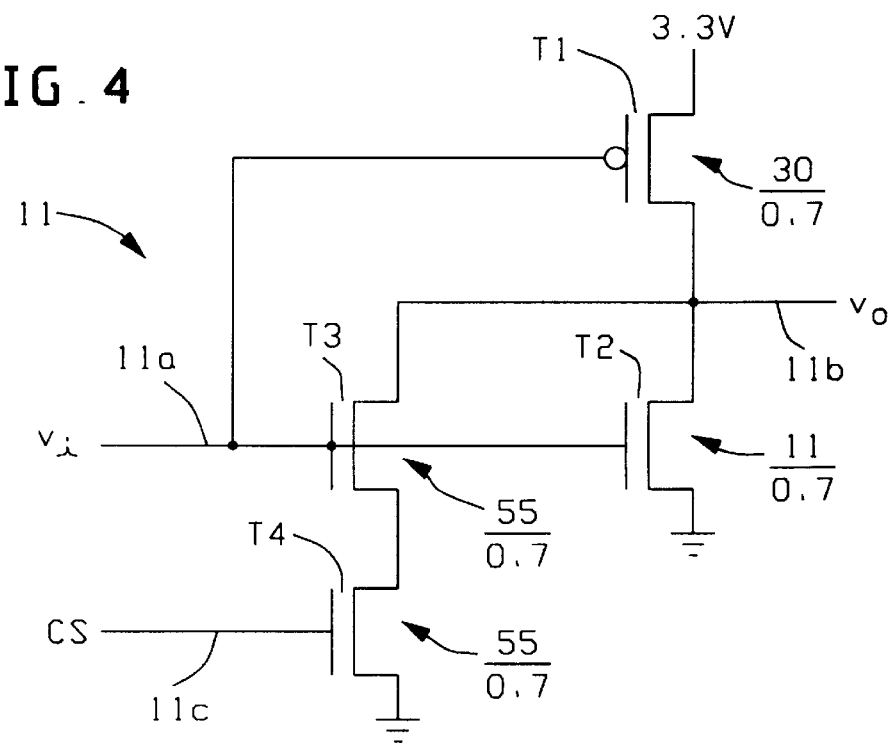
FIG. 4 is a detailed circuit diagram of one preferred embodiment of the dual threshold digital receiver circuit of FIGS. 1 and 2.

Turning now to FIG. 4, a preferred internal structure for the dual threshold digital receiver circuit 11 will be described. As FIG. 4 shows, that preferred structure includes one p-channel transistor T1 and three n-channel transistors T2, T3, and T4. Transistors T1 and T2 are connected in series between a supply voltage bus which carries 3.3 volts, and a ground bus. Transistors T3 and T4 are connected in series to the connection between the two transistors T1 and T2, and the ground bus.

Input line 11a which carries the input signal $v_i$, is connected to respective gates on the transistors T1, T2, and T3. Output line 11b which carries the output signal $v_o$, is connected to the series connection between transistors T1 and T2. And the control line 11c which carries the control signal CS is connected to the gate on transistor T4.

Also, each of the transistors T1–T4 has a channel with a particular width dimension and a particular length dimension. In FIG. 4, these width and length dimensions are shown as a ratio where channel width is given in microns as the numerator, and channel length is given in microns as the denominator. Inspection of FIG. 4 shows that the channel width for transistors T1, T2, T3, and T4 respectively is 30 microns, 11 microns, 55 microns, and 55 microns; whereas the channel length of each of those transistors is 0.7 microns.

Figure 5A:
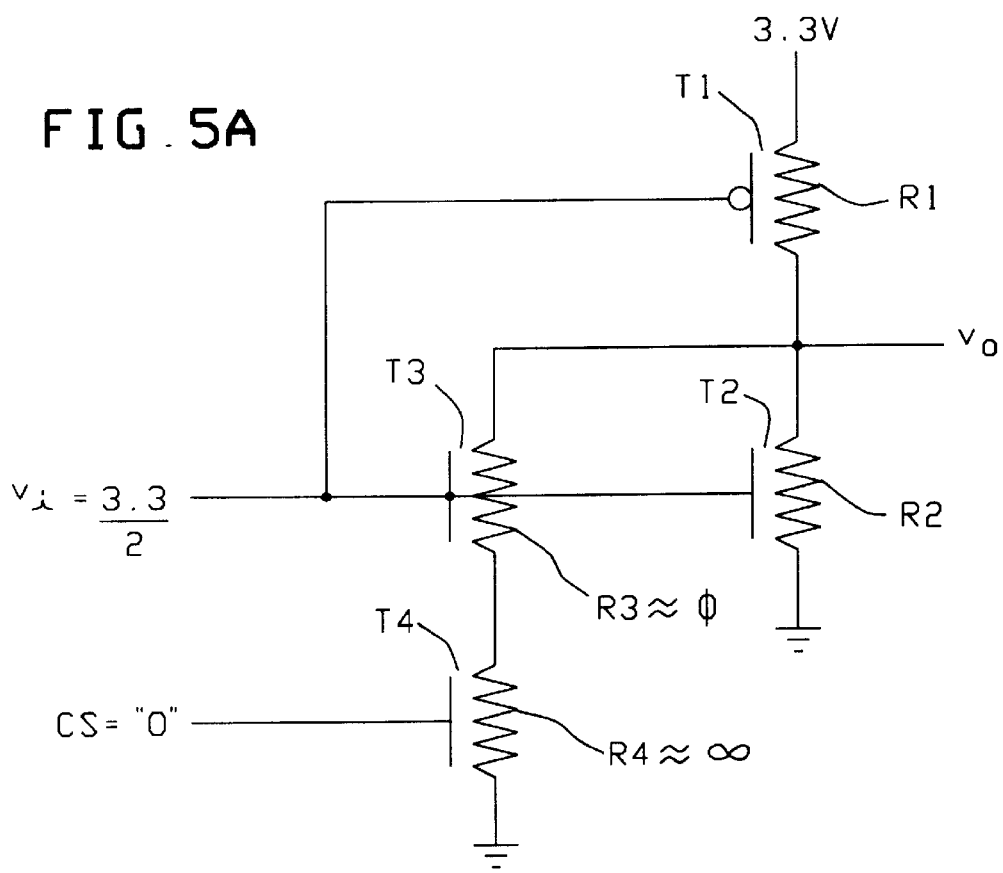
FIG. 5A is an equivalent circuit diagram for the dual threshold digital receiver circuit of FIG. 4 under the condition where the control signal is a "0" and the input signal equals the high threshold voltage.
Figure 5B:
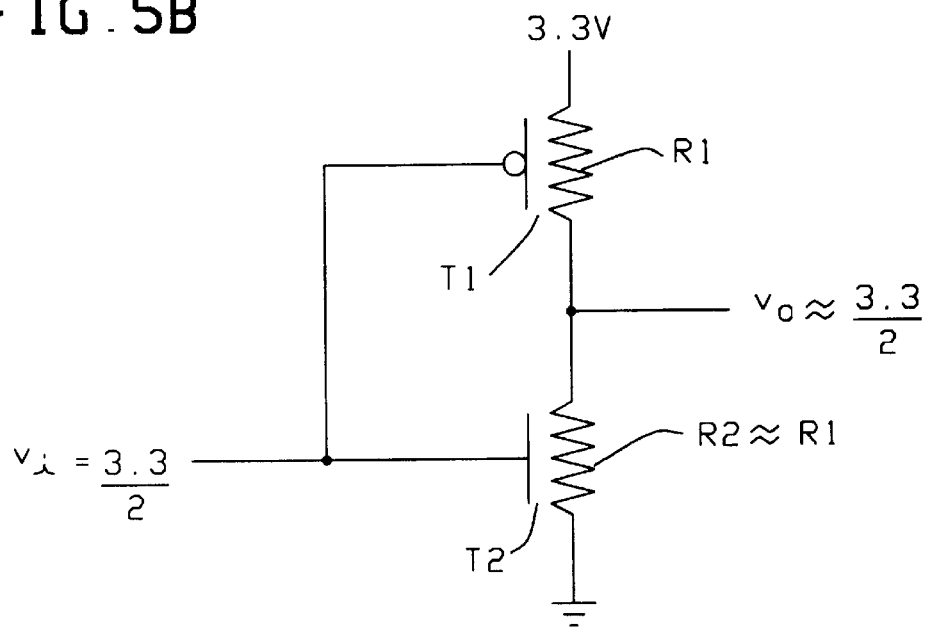
FIG. 5B is a simplification of the FIG. 5A circuit.
Figure 6A:
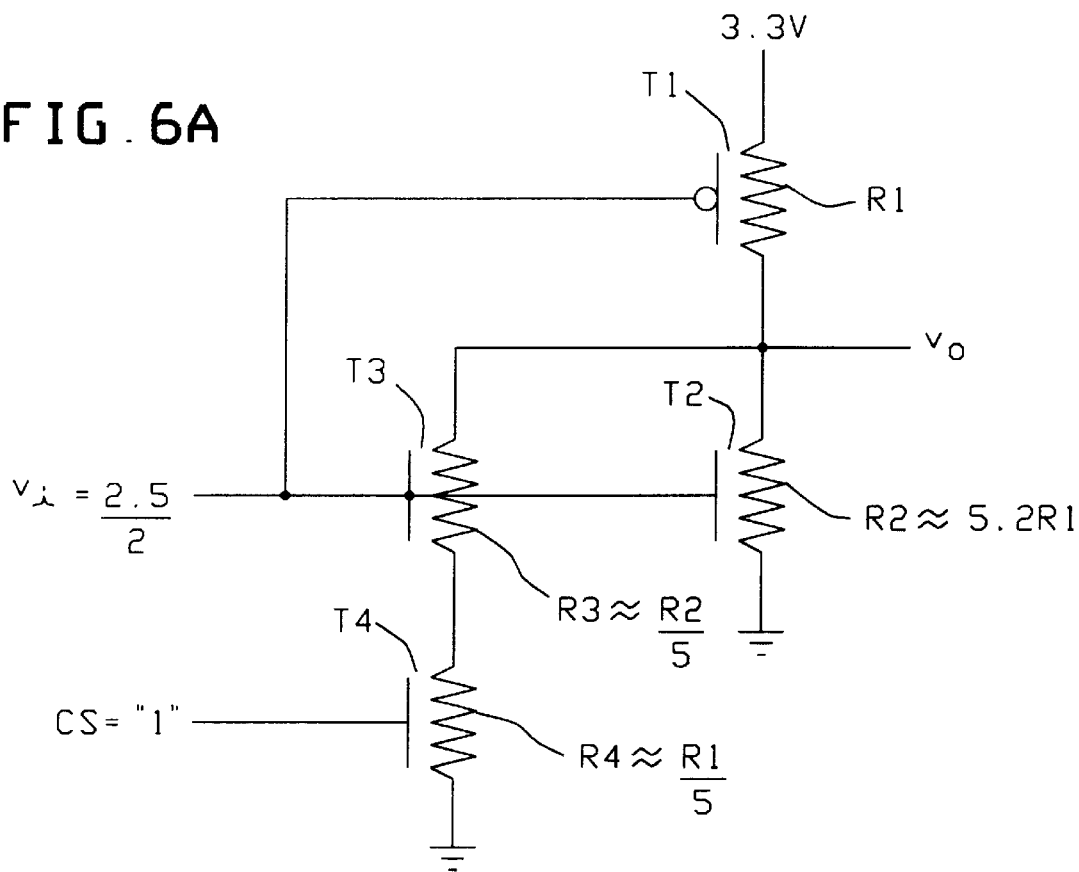
FIG. 6A is an equivalent circuit diagram of the dual threshold digital receiver circuit of FIG. 4 under the condition where the control signal is a "1" and the input voltage equals the low threshold voltage.
Figure 6B:
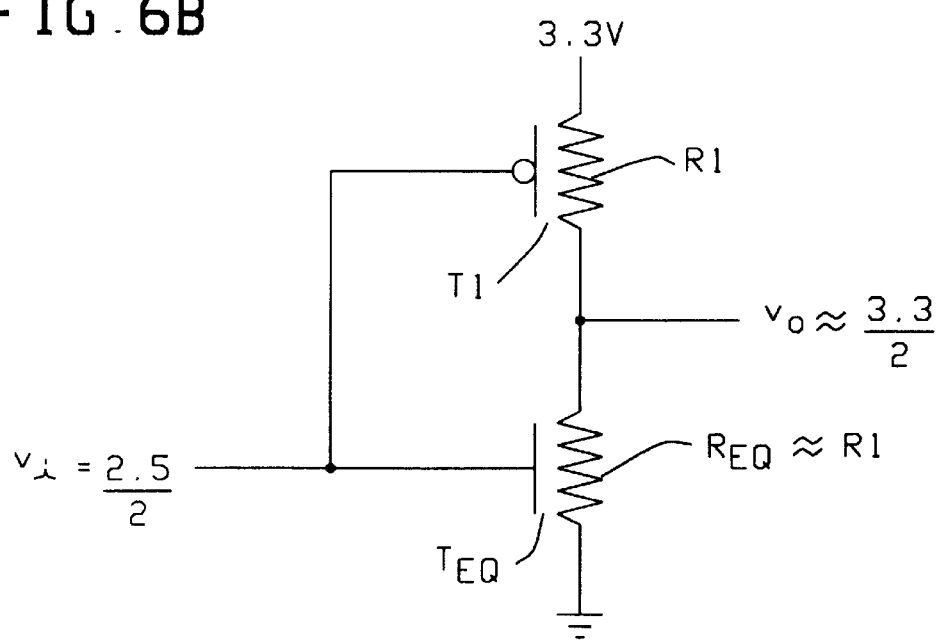
FIG. 6B is a simplification of the FIG. 6A circuit.

Due to the channel width/channel length ratios for the transistors T1 and T2 as described above; the FIG. 4 receiver 11 will operate with the high threshold $V_{TH}$ when the control signal CS is a "0"; and this mode of operation is illustrated in FIGS. 5A and 5B. By comparison, due to the channel width/channel length ratios of the transistors T3 and T4 as described above, the FIG. 4 receiver circuit 11 will operate with the low threshold voltage $V_{TL}$; and this mode of operation is illustrated in FIGS. 6A and 6B.

In FIG. 5A, the circuit of FIG. 4 is redrawn with the exception that the channel of each of the transistors T1–T4 is shown to have a certain resistance. Transistor T1 has a channel resistance R1; transistor T2 has a channel resistance R2; etc. Also in FIG. 4, the input voltage $v_i$ is at the high threshold voltage level of 3.3 volts divided by 2; and the control signal CS is a "0".

Now the magnitude of the channel resistance of any one particular transistor depends upon that transistors channel width, channel length, and gate voltage. If the gate voltage is such that the transistor is turned off, then the channel is an open circuit. If the gate voltage turns the transistor completely on, then the channel resistance is inversely proportional to the channel width and directly proportional to the channel length. And, if the gate voltage only turns the transistor partly on, then the channel resistance increases in an exponential fashion from its fully turned value as the degree to which the transistor is turned on decreases.

In FIG. 5A, the high threshold voltage of 3.3 volts divided by 2 on the input line 11a turns the transistors T1, T2, and T3 completely on; but the control signal CS=0 turns transistor T4 completely off. Consequently, transistor T4 acts as an open circuit; and that nullifies any effect of the resistance R3.

Thus, the circuit of FIG. 5A can be redrawn in a simplified fashion as shown in FIG. 5B. There, the output voltage $v_o$ is equal to the supply voltage of 3.3 volts times a resistance ratio of R2÷(R1+R2).

These resistances R1 and R2 have equal magnitudes when the input voltage $v_i$ is 3.3 volts÷2, and the channel width-length ratios are as given in FIG. 4. There, transistor T1 is given a wider width in order to compensate for the fact that a p-channel transistor is less conductive than an n-channel transistor. Thus, when $v_i$ is 3.3÷2 volts, $v_o$ is also 3.3÷2 volts.

Considering now FIG. 6A, it again illustrates the FIG. 4 circuit with the modification that the channel of each of the transistors T1–T4 is shown to have a certain resistance. Here again, the magnitude of the channel resistance of any one transistor depends upon the transistor's channel width, channel length, and gate voltage.

In FIG. 6A, the input voltage $v_i$ is 2.5 volts divided by 2. That input voltage turns transistor T1 completely on, and it turns transistors T2 and T3 only partly on. Consequently, transistor T1 has a channel resistance R1 which is the same as it was in FIG. 5B; whereas transistor T2 has a channel resistance R2 which is bigger than it was in FIG. 5B. In particular, the channel resistance R2 for transistor T2 in FIG. 6A is about 5.2 times its resistance in FIG. 5B.

Recall from FIG. 4 that transistor T3 has a channel which is about five times wider than the channel of transistor T2. Consequently in FIG. 6A, the channel resistance R3 is about one-fifth the channel resistance R2.

Transistor T4 in FIG. 6A has a gate voltage of CS="1"; and thus transistor T4 is completely turned on. Also, the channel of transistor of T4 is about five times wider than the channel of transistor of T2. Consequently, in FIG. 6A, the channel resistance R4 is about one-fifth of the fully turned on channel resistance of transistor T2 or R1÷5.

Next, the circuit of FIG. 6A can be simplified to the circuit of FIG. 6B by combining the resistances R3 and R4 into one series resistance; and by combining that series resistance in parallel with resistance R2. Such resistance combining steps yield an equivalent resistance $R_{eq}$ which, as FIG. 6B shows, is approximately equal to R1.

In FIG. 6B, the output voltage $v_o$ is equal to the supply voltage of 3.3 volts times a resistance ratio of $R_{eq}$÷(R1+$R_{eq}$). In that ratio, the resistance $R_{eq}$ equals R1; and thus the resulting ratio is approximately equal to one half. Consequently, when the input voltage $v_i$ is 2.5 volts divided by 2, the output voltage $v_o$ is equal to 3.3 volts divided by 2.

One preferred embodiment of the invention has now been described in detail. In addition however, various changes and modifications can be made to the above described details without departing from the nature and spirit of the invention.

For example, as one particular modification, the channel width ratios for transistors T3 and T4 can be changed so long as, under the input signal conditions the FIG. 6A, the total series resistance of R3+R4 remains equal to 6.2R1÷5. In other words, in FIG. 6A, the channel resistance R3 can be decreased so long as the channel resistance R4 is increased by the same amount; and vice versa.

To illustrate the above modification, FIG. 7 includes a table which gives several alternative channel width-length ratios for the transistors T3 and T4. In column C1, the channel width-length ratios which are given for the transistors T3 and T4 correspond to those which were specified in FIG. 4. By comparison, in column C2, the channel width of transistor T3 is increased to 65 microns; and that causes the partly on channel resistance R3 in FIG. 6A to decrease. Consequently, to compensate for the decrease in the R3 channel resistance, the channel width of transistor T4 is decreased to 40 microns.

Likewise, in column C3 of FIG. 7, the channel width of transistor T3 is decreased to 45 microns; and that causes the partly on channel resistance R3 in FIG. 6B to increase. Consequently, to compensate for that increased channel resistance, the channel width of transistor T4 is increased to 85 microns.

In column C4, the channel length of transistor T3 is increased to 0.8 microns; and that causes the partly on channel resistance R3 in FIG. 6A to increase. To compensate for that increased channel resistance, the channel width of transistor T4 is increased to 75 microns.

Lastly, in column C5, the channel length of transistor T4 is increased to 0.8 microns; and that causes the channel resistance R4 in FIG. 6A to increase. To compensate for that increase in the channel resistance R4, the channel width of transistor T3 is increased to 75 microns.

Further, as to another modification, the low threshold voltage $V_{TL}$ of the FIG. 4 circuit is not limited to 2.5 volts÷2. Instead, that low threshold voltage can be further reduced by decreasing the total series channel resistance R3+R4 under the conditions where the control signal CS equals a "1" and the input voltage $v_i$ equals the new low threshold voltage.

For example, suppose a new low threshold voltage of 1.7 volts÷2 is required. In that case, the total channel resistance R3+R4 of FIG. 6A needs to be reduced such that when the input signal $v_i$ equals 1.7 volts÷2, the output voltage $v_o$ equals 3.3 volts÷2. Such a reduction of the channel resistance R3+R4 may be achieved by increasing the channel width and/or decreasing the channel length of one or both of the transistors T3 and T4; and various suitable channel dimensions may be selected through computer simulation.

Also, as still another modification, a fifth transistor (not shown) can be added in parallel with transistor T4 of FIG. 4, and a second control signal can be applied to fifth transistor's gate. With that modification, the resulting circuit will have a high threshold voltage and a low threshold voltage as previously described; and in addition, it will have a new "very low" threshold voltage.

To select the new very low threshold voltage, both the fifth transistor and transistor T4 are fully turned on with their respective control signals. This lowers the total channel resistance which is in series with transistor T3; and that in turn lowers the threshold voltage of the receiver as was explained above.

Accordingly, in view of all of the above modifications which can be made to the preferred embodiment of FIG. 4, it is to be understood that the invention is not limited to just that one particular embodiment but is defined by the appended claims.

What is claimed is:

1. A method of converting one set of input signals of 0 and 3.3 volts, and another set of input signals of 0 and 2.5 volts into one set of output signals of 0 and 3.3 volts such that noise margin is maximized; said method being performed by a circuit having first and second transistors in series from a first bus at 3.3 volts to a second bus at 0 volts, and having third and fourth transistors in series from an output node between said first and second transistors to said second bus; said method including the steps of:

receiving said one set of input signals on an input which is coupled to respective gates in said first, second, and third transistors while a control signal of 0 volts is applied to a gate in said fourth transistor; and subsequently receiving said another set of input signals on said input while a control signal of 3.3 volts is applied to said gate in said fourth transistor;

selecting said transistors with respective turn-on voltages such that: a) said first and second transistors enter a fully-on state and said fourth transistor enters a fully-off state when said input signal is halfway to 3.3 volts and said control signal is at 0 volts; and, b) said first and fourth transistors enter said fully-on state and said second and third transistors enter a partially-on state when said input signal is half-way to said 2.5 volts and said control signal is at 3.3 volts;

further selecting said transistors with respective channel lengths and widths such that: a) said first, second and fourth transistors have respective channel resistances in said fully-on state of $R1_{ON}$, $R2_{ON}$ and $R4_{ON}$; b) said second and third transistors have respective channel resistances in said partially-on state of $R2_{PON}$ and $R3_{PON}$, both of which vary exponentially with gate voltage; and, c) $R2_{ON}$ equals $R1_{ON}$, and $R2_{PON}$ in parallel with $R3_{PON}$ plus $R4_{ON}$ equals $R1_{ON}$.

2. A method of converting one set of input signals with zero and high voltage levels, and another set of input signals with zero and intermediate voltage levels, into one set of output signals with zero and said high voltage levels such that noise margin is maximized, said method being performed by a circuit having first and second transistors in series from a first bus at said high voltage level to a second bus at zero volts, and having third and fourth transistors in series from an output node between said first and second transistors to said second bus; said method including the steps of:

receiving said one set of input signals on an input which is coupled to respective gates in said first, second, and third transistors while a control signal at zero volts is applied to a gate in said fourth transistor; and subsequently receiving said another set of input signals on said input while a control signal at said high voltage level is applied to said gate in said fourth transistor;

selecting said transistors with respective turn-on voltages such that said first and second transistors enter a fully-on state and said fourth transistor enters a fully-off state when said input signal is halfway to said high voltage level and said control signal is at zero volts; and said first and fourth transistors enter said fully-on state and said second and third transistors in a partially-on state when said input signal is half-way to said intermediate voltage level and said control signal is at said high voltage level;

further selecting said transistors with respective channel lengths and widths such that: a) said first, second and fourth transistors have respective channel resistances in said fully-on state of $R1_{ON}$, $R2_{ON}$ and $R4_{ON}$; b) said second and third transistors have respective channel resistances in said partially-on state of $R2_{PON}$ and $R3_{PON}$, both of which vary exponentially with gate voltage; and, c) $R2_{ON}$ equals $R1_{ON}$, and $R2_{PON}$ in parallel with $R3_{PON}$ plus $R4_{ON}$ equals $R1_{ON}$.

3. A method according to claim 2 wherein said high voltage level is 3.3 volts and said intermediate voltage level is 2.5 volts.

4. A method according to claim 2 wherein said high voltage level is 3.3 volts and said intermediate voltage level is 1.7 volts.

5. A method according to claim 2 wherein said third transistor and said fourth transistor have respective channels with equal lengths and equal widths.

6. A method according to claim 2 wherein said third transistor and said fourth transistor have respective channels with equal lengths and widths which differ from each other.

7. A method according to claim 2 wherein said third transistor and said fourth transistor have respective channels with lengths which differ substantially from each other and widths which differ from each other.

* * * * *